United States Patent [19]
Wulff et al.

[11] 3,975,613
[45] Aug. 17, 1976

[54] ELECTRON BEAM-GENERATING SYSTEM

[75] Inventors: Gunther Wulff, Trubbach, Switzerland; Josef Vogt, Balzers Furstentum, Liechtenstein

[73] Assignee: Balzers Patent und Beteiligungs AG, Liechtenstein

[22] Filed: Sept. 6, 1974

[21] Appl. No.: 503,697

Related U.S. Application Data

[63] Continuation of Ser. No. 353,400, April 23, 1973, abandoned.

[30] Foreign Application Priority Data

Apr. 26, 1972 Switzerland.......................... 6249/72

[52] U.S. Cl. .......................................... 219/121 EB
[51] Int. Cl.² ............................................ B23K 15/00
[58] Field of Search ............... 219/121 EB, 121 EM; 13/31; 335/231

[56] References Cited
UNITED STATES PATENTS

| | | |
|---|---|---|
| 3,390,222 | 6/1968 | Anderson................. 219/121 EB X |
| 3,467,057 | 9/1969 | Tamura et al. ........... 219/121 EB X |
| 3,483,417 | 12/1969 | Hanks...................... 219/121 EB X |
| 3,622,679 | 11/1971 | Kennedy.................. 219/121 EB X |

OTHER PUBLICATIONS

Electrical Engineers Handbook p. 5–52 4th ed. 1967.

*Primary Examiner*—Arthur T. Grimley
*Assistant Examiner*—G. R. Peterson
*Attorney, Agent, or Firm*—McGlew and Tuttle

[57] ABSTRACT

In an electron beam-generating system including an electron-emitting cathode, a beam focusing electrode, and an anode electrode for accelerating the emitted electrons, the magnetic fields for deflecting the beam to material to be heated and for periodically deflecting the focal spot of the beam on the material are produced by a heavy current conductor, that is, a conductor carrying a high current, arranged in proximity to the curved path of the deflected electron beam and extending perpendicular to the plane of deflection of the electron beam. The anode electrode may be formed with an opening for the passage of the electron beam, and the heavy current conductor is arranged in the proximity of the opening and parallel to the latter. The heavy current conductor may be designed as an edge of a slot-shaped opening, and may comprise a plurality of individual conductors.

8 Claims, 4 Drawing Figures

ELECTRON BEAM-GENERATING SYSTEM

This is a continuation of application Ser. No. 353,400, filed Apr. 23, 1973, now abandoned.

FIELD AND BACKGROUND OF THE INVENTION

This invention relates to electron beam generating systems and, more particularly, to a novel and improved means for producing magnetic deflection fields to deflect the electron beam to material to be heated and to effect periodic deflection of the focal spot of the beam on the material.

An electron beam source serving for the treatment of material, such as melting, evaporating, welding, etc., comprises substantially a cathode emitting the beam electrons, a focusing electrode and an anode. With such a system, there can be generated a more or less focused electron beam of variable intensity. In order to guide the electron beam to the workpiece to be treated, means for producing suitable electrostatic or magnetic fields are arranged downstream of the beam generating system, where the electron beam undergoes the desired change of direction when it passes through these means.

It has been found that it is, as a rule, advantageous for electron beam-processing machines to use only magnetic deflection fields, in order to avoid troubles, such as caused by the necessary high control voltages and because of the insulation problems on electrostatic deflection elements. Magnetic deflection fields of variable intensity can be produced, as is known, by current carrying coils or windings, which have the disadvantage however, that they require considerable space and that they are not suitable for a low frequency beam deflection, because of their impedance, or that they require an undesired high operating voltage for higher frequencies.

SUMMARY OF THE INVENTION

The objective of the invention is to provide an electron beam-generating system, with an electron-emitting cathode, a focusing electrode or Wehnelt electrode, and an additional electrode, such as an anode electrode, for accelerating emitted electrons, and with means for producing magnetic fields for deflecting the electron beam to the material to be heated and for the periodic deflection of the focal spot on the material, which system is free of the above-indicated disadvantages.

In an electron beam-generating system according to the invention, a heavy current conductor is provided, for the production of the magnetic deflection field, in the proximity of the curved path of the deflected electron beam on the inner side of the curvature, this heavy current conductor extending perpendicular to the deflection plane of the electron beam. By the term "heavy current conductor" as used above and hereinafter, there is a meant a conductor carrying a high amperage electric current.

The essential advantage of the arrangement according to the invention is that the heavy current conductor has a very low impedance for the production of the deflection field, and that a high frequency deflection of the electron beam is therefore readily possible, for which a high frequency of only a few volts is sufficient. In contrast to the known deflection of an electron beam by means of coils or windings, where substantially higher operating voltages are required, the heavy current conductor provided for the deflection, in accordance with the invention, does not require any separate high voltage duct through the wall of the vacuum chamber. Compared to the use of coils as deflection elements, the arrangement of the invention has the additional advantage of a more compact design and it requires less insulating material in the form of coil insulation, so that considerable vacuum-technical advantages are attained.

An object of the invention is to provide an improved electron beam-generating system.

Another object of the invention is to provide such an electron beam-generating system in which only a low voltage is required for the means for producing the required magnetic fields.

A further object of the invention is to provide such an electron beam-generating system which is more compact and requires less insulation.

For an understanding of the principles of the invention, reference is made to the following description of typical embodiments thereof as illustrated in the accompanying drawings.

DETAILED DESCRIPTION OF THE PREFERRED EMBODIMENTS

Figure 1:
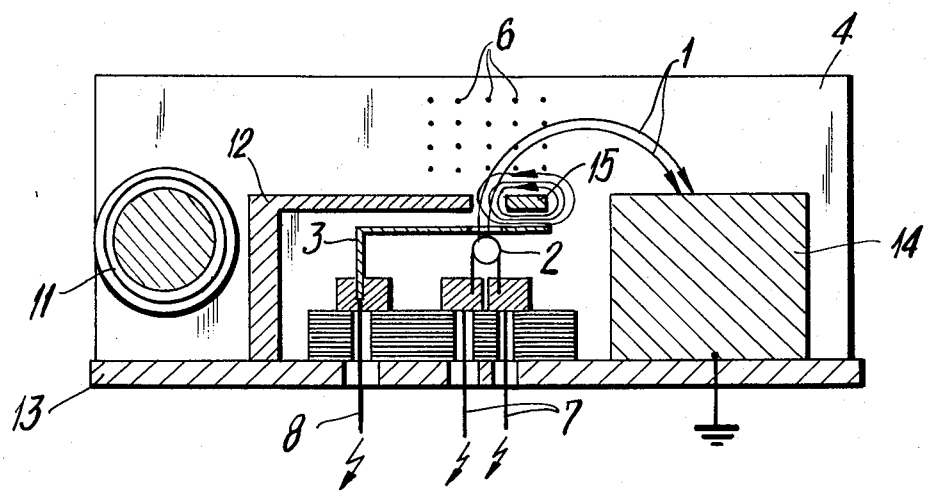
FIG. 1 is a vertical sectional view of a preferred embodiment of the invention wherein the heavy current conductor is designed as a part of the anode.
Figure 2:
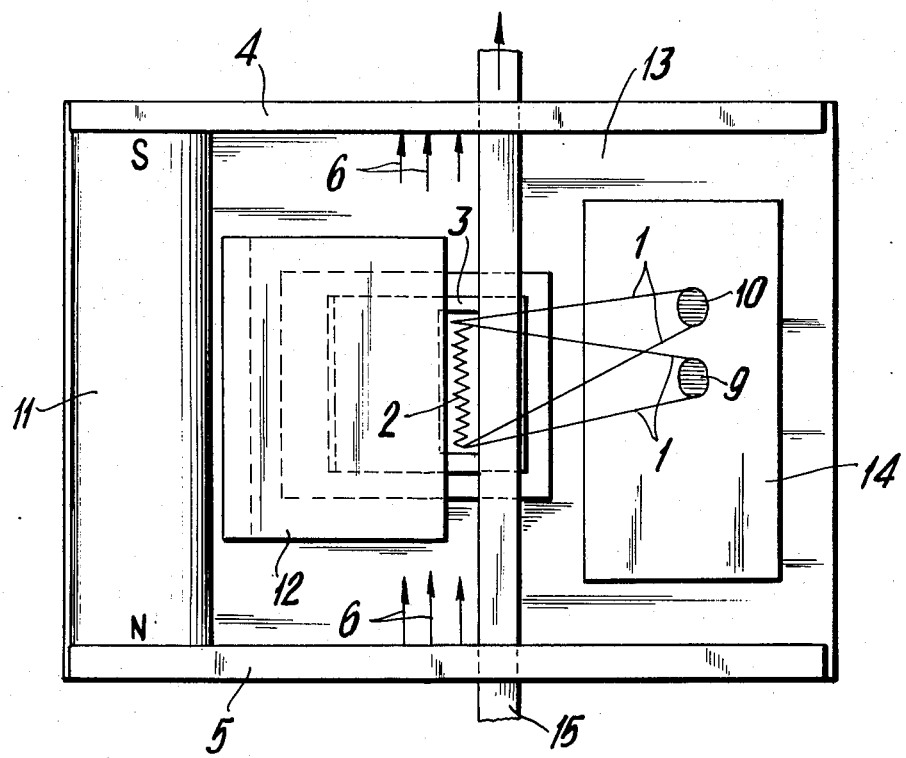
FIG. 2 is a plan view corresponding to FIG. 1.

Referring first to FIGS. 1 and 2, an electron beam is indicated at 1 as being provided by an electron-emitting cathode 2, which usually is a glow cathode. The beam is controlled by a focusing electrode 3, which may be a Wehnelt electrode, and pole shoes or pieces 4 and 5 of an electromagnetic electromagnet serve as a means for producing a magnetic field to guide the electron beam to the material to be heated. The magnetic lines of force of the guiding magnetic field are indicated at 6.

The high voltage lead to the cathode 2 and, if necessary, the heating current lead, are indicated at 7, and the high voltage lead for the focusing electrode 3 is indicated at 8. The two extreme positions assumed by the focal spot on the material to be treated in the course of the periodic deflection of beam 1 are indicated at 9 and 10. The electromagnetic field generating means includes either an exciter coil 11 or a permanent magnet, for magnetizing the pole shoes 5 and 6, with the north pole being designated N and the south pole being designated S.

The electron beam-generating system further includes an anode electrode 12, and the system as a whole is mounted on a base plate 13. The workpiece to be treated with the focused and periodically deflected beam 1 is indicated at 14, as being grounded.

In accordance with the invention, the magnetic deflecting field, for deflecting the beam to material to be heated and for periodic deflection of the focal spot of the beam on the material, is provided by a part 15 of a heavy current conductor to which is applied an AC potential or a pulsating DC potential for producing the periodic field. If an oblong cathode 2 is used for generating the electron beam, the deflecting part of heavy current conductor 15 preferably is arranged parallel to the longer side of the cathode in the proximity of the elements 2, 3 and 12 forming the system, but directly next to the path of the deflected electron beam 1. The heavy current conductor 15, as can be seen from FIG. 1, is arranged in such a way that its lines of force extend perpendicularly to the lines of force 6 of the deflection field. Furthermore, the deflecting portion of heavy current conductor 15 extends perpendicularly to the plane of deflection of electron beam 1.

If heavy current conductor 15 is supplied, in operation, with periodically variable current, the alternating magnetic field produced thereby effects a periodic deflection of the electron beam between the two end positions 9 and 10. Without a deflection field, the focal spot is located substantially midway between the points 9 and 10. With alternating currents of 100A, there has been achieved, for example, deflections of ± 10 mm from this mid position.

It is advantageous to apply to cathode 2, in operation, a high negative voltage and to apply, to focusing electrode 3, a voltage which is negative relative to the cathode voltage but is also a high voltage. Under these conditions, anode 12 can be at group potential. This permits accommodating the high voltage parts inside a protective casing formed of base plate 13 and the correspondingly shaped anode plate 12. In this embodiment of the invention, an opening, generally in the form of a rectangular slot, is provided in the anode electrode 12 for the passage of the electron beam. Furthermore, heavy current conductor 15, in the embodiment of the invention shown in FIGS. 1 and 2, is arranged in the plane of anode plate electrode 12, and thus represents, speaking functionally, a part of anode 12.

Figure 3:
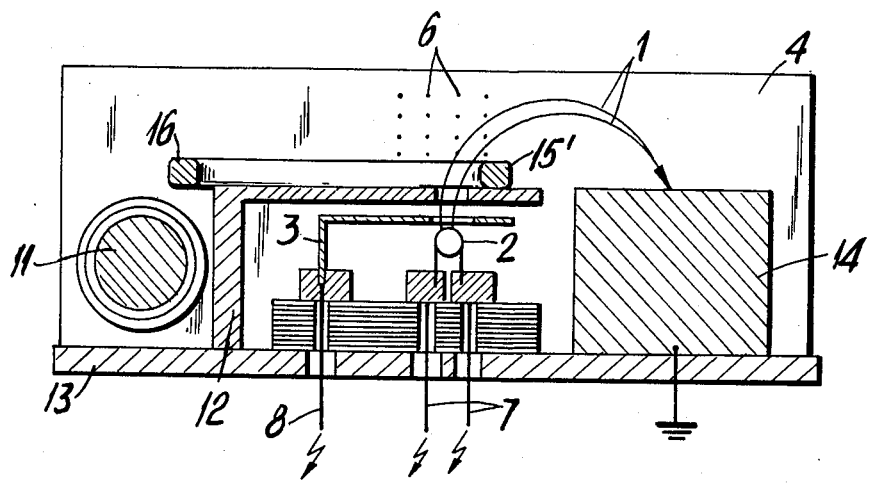
FIG. 3 is a view similar to FIG. 1 of an embodiment of the invention wherein a separate heavy current conductor is provided for producing the magnetic deflection fields.
Figure 4:
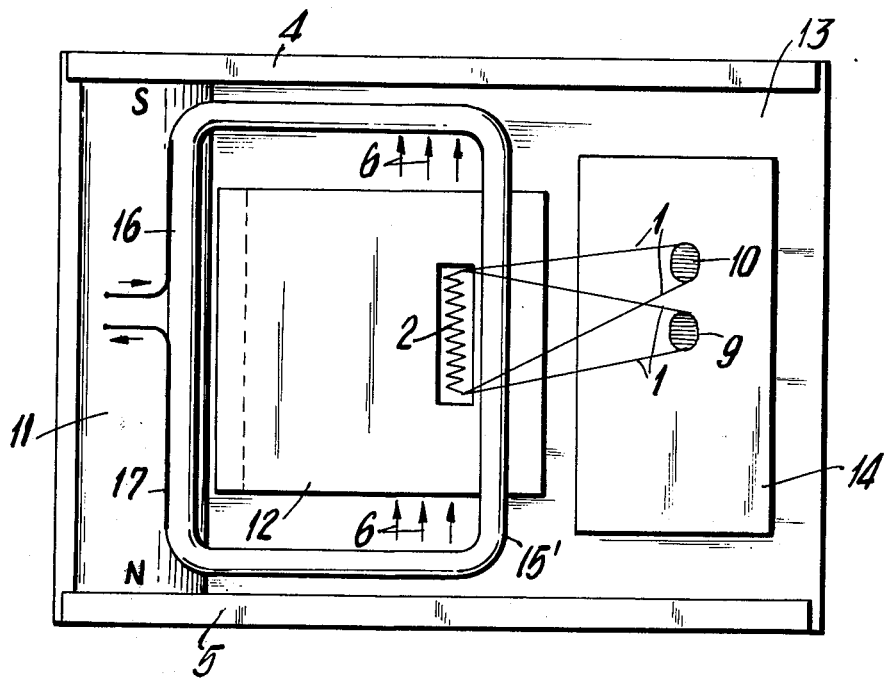
FIG. 4 is a plan view corresponding to FIG. 3.

In the embodiment of the invention shown in FIGS. 3 and 4, the heavy current conductor 15' is designed as a separate conductor but is supported by anode 12. Heavy current conductor 15' also could be arranged between anode 12 and focusing electrode 3, or between focusing electrode 3 and cathode 2. However, heavy current conductor 15' must always be positioned on the concave or inner side of the curved path of the deflected electron beam 1.

The lead-ins and shunts of the current for heavy current conductor 15' should not be arranged in the immediate proximity of the path of the electron beam 1. The best way is to bring in the leads from the outside to the pole shoes 4 and 5, shown in FIGS. 1 and 2. However, the lead-ins and shunts also can be arranged inwardly of these pole shoes, as shown in FIGS. 3 and 4. In this case, the part 16 of heavy current conductor 15' and the leads 17 are arranged so far from electron beam 1 that they no longer have any marked influence on the latter, as compared to the deflecting portion of heavy current conductor 15'. It should further be noted that heavy current conductor 15' also can comprise several parallel conductor paths, for example, the conductors 15', 16 and 17 in FIG. 3 could be designed as a coil or winding.

While specific embodiments of the invention have been shown and described in detail to illustrate the application of the principles of the invention, it should be understood that the invention may be embodied otherwise without departing from these principles.

What is claimed is:

1. In an electron beam-generating system including an electoron-emitting cathode, a beam focusing electrode, a further electrode constituting an anode for accelerating the emitted electrons, means for producing a first magnetic field extending transversely of the beam to deflect the beam, along a curved path in a plane perpendicular to the magnetic field, to a focal spot on material to be heated, and means for effecting periodic deflection of the focal spot of the beam on the material, the improvement comprising, in combination, a single magnet having opposite polarity pole pieces extending, in the direction of the curved path of the electron beam, in spaced parallel relation on opposite sides of the electron beam, and constituting said means producing said transversely extending magnetic field for deflecting the beam along a curved path to a focal spot on material to be heated; a large cross-sectional area, low impedance, rectilinear high current carrying conductor of non-magnetic material extending perpendicular to the plane of deflection of the electron beam across the electron beam in close proximity to the curved path of the deflected electron beam and closely adjacent the concave side of the curved path of the deflected electron beam, said high current carrying conductor constituting said means for periodic deflection of the focal spot of the beam on the material and, responsive to a current-flow therethrough, producing therearound a second electric field in which the lines of force intersect perpendicularly the lines of force of said first magnetic field and extend parallel to said plane; and current supply lines connected to said conductor to supply a high density, low voltage, high frequency electric current to flow therethrough to produce the electric field surrounding said high current-carrying conductor and which alternates in direction, whereby said focal spot is deflected alternately in opposite directions which are transverse to said plane; said current supply lines being so located, relative to the electron beam, that their electric fields have no marked influence on the electron beam.

2. In an electron beam-generating system, the improvement claimed in claim 1, in which said anode is formed with an elongated opening for the passage of the electron beam; said high current carrying conductor being arranged in the proximity of said opening and extending parallel to the longer dimension thereof.

3. In an electron beam-generating system, the improvement claimed in claim 1, in which said opening is an elongated rectangular opening.

4. In an electron beam-generating system, the improvement claimed in claim 3, in which a portion of said anode is planar; said high current carrying conductor being arranged in the plane of said anode to define one longer edge of said opening, and functionally constituting a part of said anode.

5. In an electron beam-generating system, the improvement claimed in claim 1, in which said high current carrying conductor forms an edge of a slot-shaped opening.

6. In an electron beam-generating system, the improvement claimed in claim 1, in which said high current carrying conductor comprises several current conducting paths.

7. In an electron beam-generating system, the improvement claimed in claim 6, in which said high current carrying conductor comprises a substantially rectangular coil having one rectilinear leg extending perpendicular to the plane of deflection of the electron beam in proximity to the curved path of the deflected electron beam and adjacent the concave side of the curved path of the deflected electron beam; said substantially rectangular coil including a second rectilinear leg extending parallel to said high current carrying conductor leg and spaced a very substantial distance from the convex side of the curved path of the deflected electron, the spacing of said second rectilinear leg from the convex side of the curved path of the deflected electron beam being a high multiple of the spacing of said high current carrying conductor leg from the convex side of the curved path of the deflected electron beam; said substantially rectangular coil including a pair of parallel rectilinear third legs interconnecting said high current carrying conductor leg and said second rectilinear leg and each spaced a very substantial distance laterally of the curved path of the deflected electron beam; said current supply means being connected to said second rectilinear leg of said substantially rectangular coil.

8. In an electron beam-generating system, the improvement claimed in claim 7, in which said coil is supported on said anode.

* * * * *